(12) United States Patent
Gonzalez et al.

(10) Patent No.: US 7,279,725 B2
(45) Date of Patent: *Oct. 9, 2007

(54) VERTICAL DIODE STRUCTURES

(75) Inventors: Fernando Gonzalez, Boise, ID (US);
Tyler A. Lowrey, Boise, ID (US);
Trung Tri Doan, Boise, ID (US);
Raymond A. Turi, Boise, ID (US);
Graham R. Wolstenholme, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

This patent is subject to a terminal disclaimer.

(21) Appl. No.: 11/210,401

(22) Filed: Aug. 24, 2005

(65) Prior Publication Data

US 2005/0280117 A1 Dec. 22, 2005

Related U.S. Application Data

(60) Division of application No. 10/804,477, filed on Mar. 19, 2004, now Pat. No. 7,166,875, which is a continuation of application No. 10/104,240, filed on Mar. 22, 2002, now Pat. No. 6,784,046, which is a division of application No. 09/505,953, filed on Feb. 16, 2000, now Pat. No. 6,750,091, which is a division of application No. 09/150,317, filed on Sep. 9, 1998, now Pat. No. 6,194,746, which is a division of application No. 08/932,791, filed on Sep. 5, 1997, now Pat. No. 5,854,102, which is a continuation of application No. 08/609,505, filed on Mar. 1, 1996, now abandoned.

(51) Int. Cl.
*H01L 29/00* (2006.01)

(52) U.S. Cl. .............. 257/104; 257/106; 257/536; 257/537; 257/603; 257/910; 257/E31.084; 257/E31.099; 257/E27.046; 257/E27.051; 257/E29.327

(58) Field of Classification Search ........... 257/104, 257/106, 536, 537, 603, 910, E31.084, E31.099, 257/E27.046, E27.051, E29.327
See application file for complete search history.

(56) References Cited

U.S. PATENT DOCUMENTS 3,615,929 A    10/1971   Portnoy et al.

(Continued)

FOREIGN PATENT DOCUMENTS

DE          10005774 A1    8/2001

(Continued)

OTHER PUBLICATIONS

Wolf, "Silicon Processing for the VLSI Era," vol. 1, Process Technology, pp. 136-139, Lattice Press.
International Search Report dated Jul. 2, 1997 (3 pages).

*Primary Examiner*—Michelle Estrada
(74) *Attorney, Agent, or Firm*—TraskBritt

(57) ABSTRACT

A method of making a vertical diode structure is provided, the vertical diode structure having associated therewith a diode opening extending through an insulation layer and contacting an active region on a silicon wafer. A titanium silicide layer covers the interior surface of the diode opening and contacts the active region. The diode opening is initially filled with an amorphous silicon plug that is doped during deposition and subsequently recrystallized to form large grain polysilicon. The silicon plug has a top portion that is heavily doped with a first type dopant and a bottom portion that is lightly doped with a second type dopant. The top portion is bounded by the bottom portion so as not to contact the titanium silicide layer. For one embodiment of the vertical diode structure, a programmable resistor contacts the top portion of the silicon plug and a metal line contacts the programmable resistor.

6 Claims, 14 Drawing Sheets

U.S. PATENT DOCUMENTS

| | | |
|---|---|---|
| 3,664,896 A | 5/1972 | Duncan |
| 3,777,364 A | 12/1973 | Schinella et al. |
| 3,914,137 A | 10/1975 | Huffman et al. |
| 3,928,095 A | 12/1975 | Harigaya et al. |
| 3,990,099 A | 11/1976 | Duigon et al. |
| 4,404,737 A | 9/1983 | Kanzaki et al. |
| 4,414,737 A | 11/1983 | Menjo et al. |
| 4,530,149 A | 7/1985 | Jastrzebski et al. |
| 4,589,193 A | 5/1986 | Goth et al. |
| 4,619,887 A | 10/1986 | Hooper et al. |
| 4,666,556 A | 5/1987 | Fulton et al. |
| 4,742,014 A | 5/1988 | Hooper et al. |
| 4,784,969 A | 11/1988 | Nitayama |
| 4,922,319 A | 5/1990 | Fukushima |
| 5,022,742 A | 6/1991 | Hains |
| 5,070,383 A | 12/1991 | Sinar et al. |
| 5,162,245 A | 11/1992 | Favreau |
| 5,163,178 A | 11/1992 | Gomi et al. |
| 5,213,989 A | 5/1993 | Fitch et al. |
| 5,231,038 A | 7/1993 | Yamaguchi et al. |
| 5,236,851 A | 8/1993 | Kameyama et al. |
| 5,236,852 A | 8/1993 | Cherniawski et al. |
| 5,268,316 A | 12/1993 | Robinson et al. |
| 5,272,097 A | 12/1993 | Shiota |
| 5,355,301 A | 10/1994 | Saito et al. |
| 5,365,112 A * | 11/1994 | Ohshima .................... 257/784 |
| 5,366,908 A | 11/1994 | Palella |
| 5,407,851 A | 4/1995 | Roesner |
| 5,420,053 A | 5/1995 | Miyazaki |
| 5,441,907 A | 8/1995 | Sung et al. |
| 5,464,782 A | 11/1995 | Koh |
| 5,494,848 A | 2/1996 | Chin |
| 5,508,224 A | 4/1996 | Jang |
| 5,510,287 A | 4/1996 | Chen et al. |
| 5,529,943 A | 6/1996 | Hong et al. |
| 5,550,075 A | 8/1996 | Hsu et al. |
| 5,567,644 A | 10/1996 | Rolfson et al. |
| 5,571,738 A * | 11/1996 | Krivokapic .................. 438/291 |
| 5,589,418 A | 12/1996 | Kalnitsky |
| 5,597,741 A | 1/1997 | Sakamoto et al. |
| 5,616,946 A | 4/1997 | Hsu et al. |
| 5,648,283 A * | 7/1997 | Tsang et al. ................. 438/138 |
| 5,652,182 A | 7/1997 | Cleeves |
| 5,670,417 A | 9/1997 | Lambson et al. |
| 5,683,939 A | 11/1997 | Schrantz et al. |
| 5,714,768 A | 2/1998 | Ovshinsky et al. |
| 5,739,563 A | 4/1998 | Kawakubo et al. |
| 5,773,346 A | 6/1998 | Manning |
| 5,780,343 A | 7/1998 | Bashir |
| 5,789,769 A * | 8/1998 | Yamazaki .................... 257/263 |
| 5,801,417 A * | 9/1998 | Tsang et al. ................. 257/333 |
| 5,804,476 A | 9/1998 | Jang |
| 5,856,214 A | 1/1999 | Yu |
| 5,998,244 A | 12/1999 | Wolstenholme et al. |
| 6,057,195 A | 5/2000 | Wu |
| 6,194,746 B1 * | 2/2001 | Gonzalez et al. ........... 257/104 |
| 6,420,725 B1 | 7/2002 | Harshfield |

FOREIGN PATENT DOCUMENTS

| | | |
|---|---|---|
| JP | 357176762 A | 10/1982 |
| JP | 01112780 | 5/1989 |
| JP | 01196863 A | 8/1989 |
| JP | 403014270 A | 1/1991 |
| JP | 03280582 A | 12/1991 |
| JP | 04-219922 | 8/1992 |

* cited by examiner

VERTICAL DIODE STRUCTURES

CROSS-REFERENCE TO RELATED APPLICATIONS

This application is a divisional of application Ser. No. 10/804,477, filed Mar. 19, 2004, now U.S. Pat. No. 7,166,875, issued Jan. 23, 2007, which is a continuation of application Ser. No. 10/104,240, filed Mar. 22, 2002, now U.S. Pat. No. 6,784,046, issued Aug. 31, 2004, which is a divisional of application Ser. No. 09/505,953, filed on Feb. 16, 2000, now U.S. Pat. No. 6,750,091, issued Jun. 15, 2004, which is a divisional of application Ser. No. 09/150,317, filed on Sep. 9, 1998, now U.S. Pat. No. 6,194,746, issued Feb. 27, 2001, which is a divisional of application Ser. No. 08/932,791, filed on Sep. 5, 1997, now U.S. Pat. No. 5,854,102, issued Dec. 29, 1998, which is a continuation of application Ser. No. 08/609,505, filed on Mar. 1, 1996, now abandoned, all of the foregoing being incorporated herein by reference.

BACKGROUND OF THE INVENTION

1. The Field of the Invention

The present invention relates to vertical diodes and, more specifically, to vertical diodes with low series resistance formed on a silicon wafer.

2. The Relevant Technology

One of the common trends in the electronics industry is the miniaturization of electronic devices. This trend is especially true for electronic devices operated through the use of semiconductor microchips. Microchips are commonly viewed as the brains of most electronic devices. In general, a microchip comprises a small silicon wafer upon which can be built thousands of microscopic electronic devices that are integrally configured to form electronic circuits. The circuits are interconnected in a unique way to perform a desired function.

With the desire to decrease the size of electronic devices, it is also necessary to decrease the size of the microchip and electronic devices thereon. This movement has increased the number and complexity of circuits on a single microchip.

One common type of electronic device found on a microchip is a diode. A diode functions as a type of electrical gate or switch. An ideal diode will allow an electrical current to flow through the diode in one direction but will not allow an electrical current to flow through the diode in the opposite direction. In conventional diodes, however, a small amount of current flows in the opposite direction. This is referred to as current leakage.

Conventional diodes are typically formed from a silicon material that is modified through a doping process. Doping is a process in which ions are implanted within the silicon. There are two general types of dopants: P-type dopants and N-type dopants. P-type dopants are materials that, when implanted within the silicon, produce regions referred to as holes. These holes can freely accept electrons. In contrast, N-type dopants are materials that, when implanted within silicon, produce extra electrons. The extra electrons are not tightly bound and thus can easily travel through the silicon. In general, a diode is formed when a material doped with a P-type dopant is connected to a material doped with an N-type dopant.

Conventional diodes are configured by positioning the two opposing doped materials side by side on a microchip. This side-by-side positioning, however, uses a relatively large amount of surface space on the microchip. As a result, larger microchips are required.

Furthermore, for a diode to operate, each side of the diode must have an electrical connection that either brings electricity to or from the diode. The minimal size of each side of the diode is in part limited in that each side must be large enough to accommodate an electrical connection. Since conventional diodes have a side-by-side configuration with each side requiring a separate electrical connection, the ability to miniaturize such diodes is limited. In addition, the requirement of having side-by-side electrical connections on a single diode increases the size and complexity of the microchip.

Attempts have been made to increase the efficiency and current flow rate through a diode so as to speed up the microchip. In one attempt to accomplish this end, one of the sides of the diode is heavily doped and the other side of the diode is lightly doped. The lightly doped side limits the current, and the heavily doped side increases the reverse bias leakage. Thus, such a configuration produces minimal gain.

Other attempts have been made to decrease the resistance in the above-discussed diode by increasing the dopant concentration on the lightly doped side of the diode. As the dopant concentration is increased, however, current leakage in the diode increases. In turn, the current leakage decreases the current efficiency and functioning of the microchip.

SUMMARY OF THE INVENTION

It is, therefore, an object of the present invention to provide improved diodes and their method of manufacture.

Another object of the present invention is to provide improved diodes that use a minimal amount of surface area on a microchip.

Still another object of the present invention is to provide improved diodes that are easily connected to other electronic devices of an integrated circuit.

Another object of the present invention is also to provide improved diodes having improved current flow and efficiency.

It is another object of the present invention to provide improved diodes having a heavily doped area and a lightly doped area with minimal resistance and current leakage.

Yet another object of the present invention is to provide improved diodes that can be selectively sized.

Finally, another object of the present invention is to provide improved diodes having a minimal cost.

These and other objects and features of the present invention will become more fully apparent from the following description and appended claims, or may be learned by the practice of the invention as set forth hereinafter.

In order to achieve the above objectives and in accordance with the invention as claimed and broadly described herein, a vertical diode is provided on a silicon wafer. The silicon wafer is doped with a first type of dopant and has an exposed surface. A vertical diode incorporating features of the present invention is manufactured by initially highly doping the exposed surface of the silicon wafer with a second type of dopant to form an active region.

Next, the active region is covered by a refractory metal silicide layer, preferably titanium silicide. The silicide layer has a relatively low resistance and, thus, ultimately decreases the resistance through the vertical diode. An insulation layer, such as silicon dioxide, is then formed over the refractory metal silicide layer. The insulation layer is formed using conventional oxidation deposition processes.

A conventional masking and etching process is used to etch a diode trench through the insulation layer so as to expose a portion of the refractory metal silicide layer. The diode trench is defined by an interior surface which contacts the refractory metal silicide layer.

The diode trench is next filled with amorphous silicon which is then lightly doped with the second type of dopant. The amorphous silicon forms a silicon plug within the diode trench. The silicon plug has a bottom portion contacting the refractory metal silicide layer and a top portion separated from the refractory metal silicide layer by the bottom portion.

The amorphous silicon is next heated to recrystallize the amorphous silicon into large grain polysilicon. The second portion of the silicon plug, now converted into polysilicon, is then heavily doped with the first type of dopant. The doping is performed by ion implantation followed by a heat treatment, such as RTP, for activation of the dopant. Finally, a metal contact is secured to the top portion of the silicon plug to complete the vertical diode.

Since the diode has a vertical formation, use of the surface area on the silicon microchip is minimized. Furthermore, as there is only one connection point on top of the diode, the diode is easier to connect to other elements and is easier to size.

In one alternative embodiment, a programmable resistor is positioned between the metal contact and the top portion of the silicon plug. The programmable resistor comprises chalcogenide material and barrier materials. One preferred barrier material is titanium nitride. The programmable resistor allows the diode to have memory characteristics.

In yet another alternative embodiment, a second refractory metal silicide layer is formed on the interior surface of the diode trench prior to deposition of the amorphous silicon. This second silicide layer, which is preferably titanium silicide, is used to decrease the resistance through the lightly doped end of the inventive diode.

Formation of the second refractory metal silicide layer is preferably accomplished by initially depositing a layer of sacrificial polysilicon on the interior surface of the diode trench. A blanket layer of titanium or some other refractory metal is then deposited over the polysilicon layer. Sintering is then used to form the two layers into titanium silicide.

The present invention also discloses other embodiments of novel vertical diodes having low series resistance. For example, in one embodiment the silicon wafer has an oxide layer with a hole etched therethrough to communicate with a silicon substrate. The silicon substrate is doped with a P-type dopant. The hole in the oxide layer is filled with a polysilicon plug that is heavily doped with an N-type dopant. The resulting silicon wafer is heated to a temperature sufficient to cause a portion of the dopants in the polysilicon plug to diffuse into the silicon substrate. As a result, a diode is formed having a junction located within the silicon substrate. If desired, a programmable resistor and metal contact can then be positioned on top of the polysilicon plug.

Finally, in yet another alternative embodiment, a vertical diode is formed by initially lightly doping a silicon substrate with a P-type dopant to form an active region. An oxide layer is then deposited over the silicon substrate. Holes are etched through the oxide layer down to the active region in the silicon substrate. The entire silicon wafer is then positioned within a reactor chamber where an epitaxial silicon layer is grown at the bottom of the holes against the active region. Once the epitaxial silicon layer is grown, the remaining portion of the holes are filled with a polysilicon plug that is heavily doped with an N-type dopant. The silicon wafer is then exposed to an elevated temperature that causes a portion of the dopants in the polysilicon plug to diffuse into a top portion of the epitaxial silicon layer. As a result, a diode is formed wherein the junction is positioned within the epitaxial silicon layer. As before, a programmable resistor and metal contact can then be positioned on top of the polysilicon plug.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not, therefore, to be considered to be limiting of its scope, the invention will be described and explained with additional specificity and detail through the use of the accompanying drawings in which.

DETAILED DESCRIPTION OF THE PREFERRED EMBODIMENTS

Figure 1:
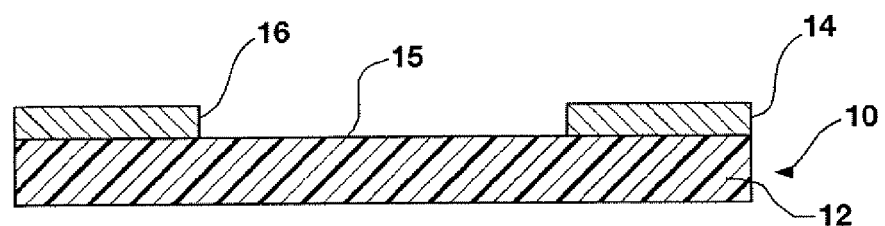
FIG. 1 is a cross-sectional elevation view of a silicon wafer having an oxide layer covering a portion thereof.

The present invention relates to improved vertical diodes and methods for manufacturing such diodes on a silicon wafer. Depicted in FIG. 1 is a layered wafer 10 used in constructing one embodiment of a vertical diode incorporating features of the present invention. Layered wafer 10 comprises a conventional silicon wafer 12 overlaid by an oxide layer 14. Silicon wafer 12 is doped with a first type dopant. As used in the specification and appended claims, the terms "first type dopant" and "second type dopant" can each refer either to an N-type dopant or a P-type dopant. However, once a convention is selected for manufacturing of a diode, the convention must be maintained. That is, either all first type dopants must be N doped and all second type dopants P doped, or all first type dopants must be P doped and all second type dopants N doped.

Figure 2:
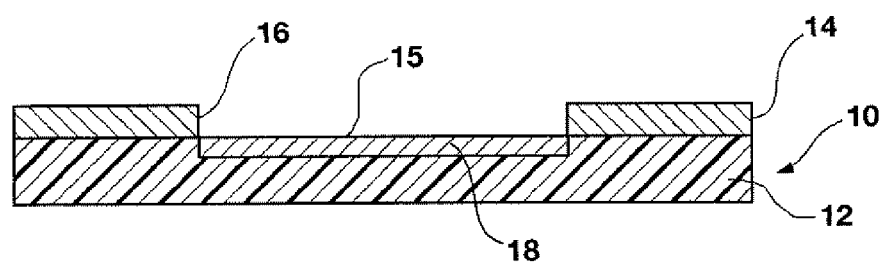
FIG. 2 is a cross-sectional elevation view of the silicon wafer in FIG. 1 having an active region.

Oxide layer 14 is shown as having a hole 16 formed therethrough to expose a contact surface 15 on silicon wafer 12. Hole 16 can be formed using any conventional masking and etching processes. As shown in FIG. 2, an active region 18 is formed in silicon wafer 12 by heavily doping silicon wafer 12 through contact surface 15 with a second type dopant.

Figure 2A:
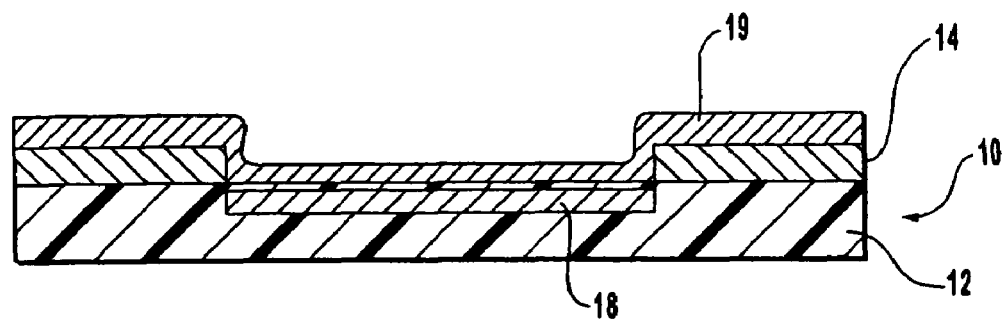
FIG. 2A is a cross-sectional elevation view of the silicon wafer in FIG. 2 having a refractory metal deposited thereon so as to cover the active region.
Figure 2B:
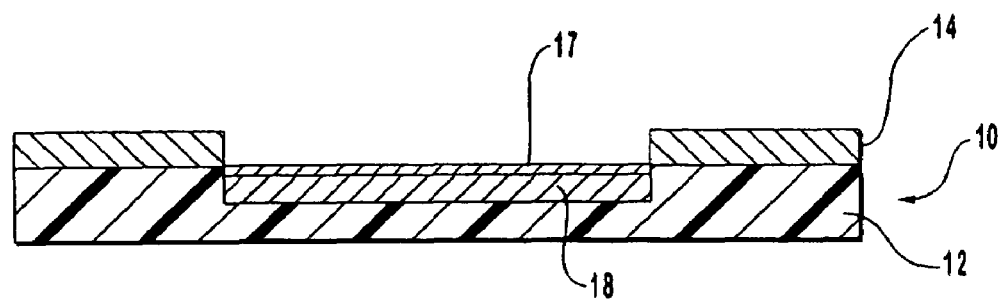
FIG. 2B is a cross-sectional elevation view of the silicon wafer in FIG. 2A having the refractory metal partially removed and converted to a silicide layer over the active region.

Once active region 18 is obtained, a refractory metal silicide layer 17, seen in FIG. 2B, is formed over active region 18. As depicted in FIG. 2A, refractory metal silicide layer 17 is formed by initially depositing a refractory metal layer 19 over layered wafer 10 so as to contact and cover active region 18. Refractory metal layer 19 preferably has a thickness ranging from about 500 Angstroms to about 1000 Angstroms. Deposition of refractory metal layer 19 may be accomplished by sputtering, chemical vapor deposition, or most other processes by which such metals are deposited. Refractory metal layer 19 is preferably formed of titanium (Ti), however, other refractory metals such as tungsten (W), tantalum (Ta), cobalt (Co), and molybdenum (Mo) can also be used.

Next, rapid thermal processing (RTP) is used to sinter refractory metal layer 19. The sintering step is performed in a nitrogen-($N_2$—) rich environment at a temperature ranging from about 500° C. to about 650° C. For the formation of titanium silicide, the preferred exposure time ranges between about 10 seconds to about 20 seconds.

As a result of the sintering, the top or exposed portion of refractory metal layer 19 reacts with the surrounding nitrogen to form a nitride, for example, TiN. In contrast, the portion of refractory metal layer 19 adjacent to active region 18 reacts with the silicon to form refractory metal silicide layer 17 seen in FIG. 2B. The composition of refractory metal silicide layer 17 is dependent on the refractory metal used. Where Ti is used, refractory metal silicide layer 17 is $TiSi_2$. Other silicides that can be formed include, by way of example, $WSi_2$, $TaSi_2$, $CoSi_2$, and $MoSi_2$.

Next, layered wafer 10 is etched to remove the refractory metal nitride but leave refractory metal silicide layer 17. The resulting configuration, as shown in FIG. 2B, has refractory metal silicide layer 17 both contacting and covering active region 18.

Figure 3:
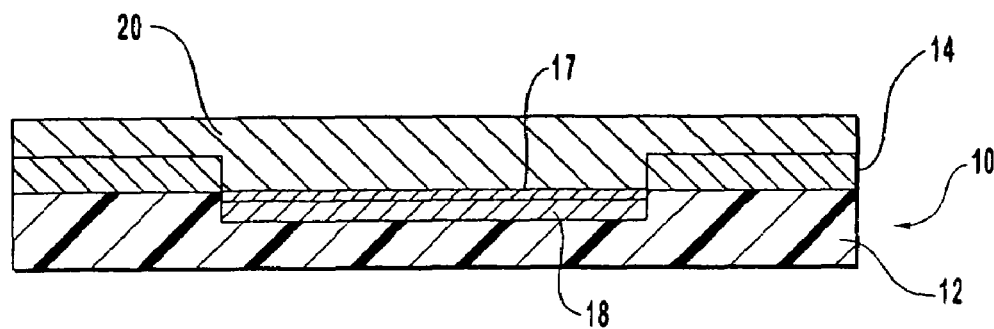
FIG. 3 is a cross-sectional elevation view of the silicon wafer in FIG. 2B having an insulation layer covering the silicide layer.

Once refractory metal silicide layer 17 is obtained, an insulation layer 20 is formed over layered wafer 10 so as to cover refractory metal silicide layer 17. Insulation layer 20 is preferably silicon dioxide ($SiO_2$) formed through a deposition oxidation process. Although most conventional deposition oxidation processes will work, high temperature, thermal oxidation processes are preferably not used. The use of high temperatures during oxidation can drive the dopant out of active region 18. Accordingly, it is preferred that the deposition oxidation process be performed at a temperature ranging from about 750° C. to about 900° C. Insulation layer 20 is next planarized by either chemical-mechanical polishing (CMP) or photoresist etchback, as shown in FIG. 3.

Figure 4:
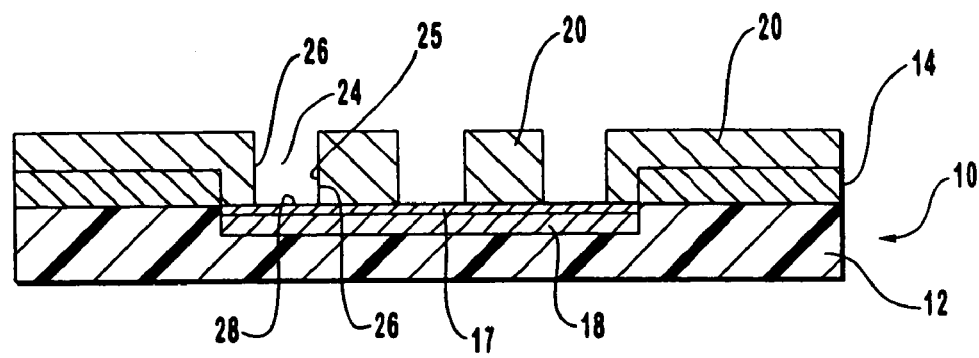
FIG. 4 is a cross-sectional elevation view of a plurality of diode trenches extending through the insulation layer of FIG. 3 and to the silicide layer.

As depicted in FIG. 4, a diode trench 24 is next formed through insulation layer 20 using conventional masking and etching processes. Diode trench 24 extends through insulation layer 20 and accesses refractory metal silicide layer 17 in contact with active region 18. Diode trench 24 is further defined by an interior surface 25 which comprises opposing sidewalls 26 formed from insulation layer 20 and a floor 28 formed from a portion of refractory metal silicide layer 17. As shown in FIG. 4 and each of the other figures, a plurality of diode trenches 24 and subsequent diode structures can simultaneously be made. Since each of the diode trenches and the diodes formed therein are substantially identical, however, reference will only be made to a single structure.

Figure 5:
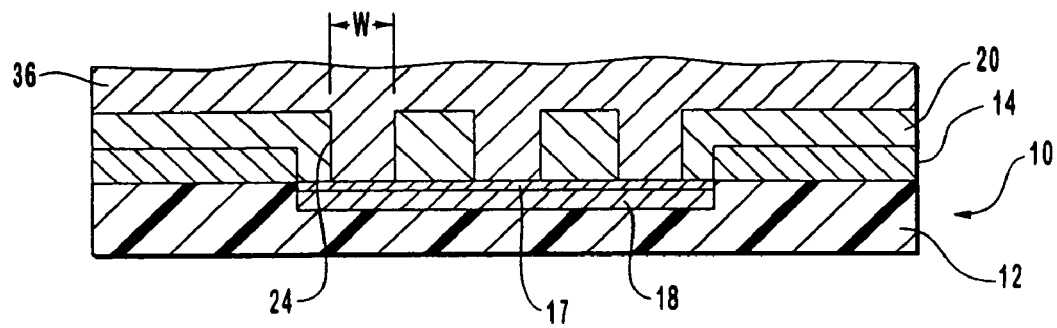
FIG. 5 is a cross-sectional elevation view of the silicon wafer in FIG. 4 having amorphous silicon filling the diode trenches.

As shown in FIG. 5, the next manufacturing step entails filling each diode trench 24 with amorphous silicon. The filling step is accomplished by initially depositing an amorphous silicon layer 36 over layered wafer 10, thereby simultaneously covering insulation layer 20 and either substantially or completely filling each diode trench 24. Amorphous silicon layer 36 is preferably deposited using an open or closed tube deposition process that simultaneously deposits and dopes amorphous silicon layer 36. Once amorphous silicon layer 36 is deposited, the amorphous silicon is lightly doped with the same dopant (second type dopant) as active region 18.

Figure 6:
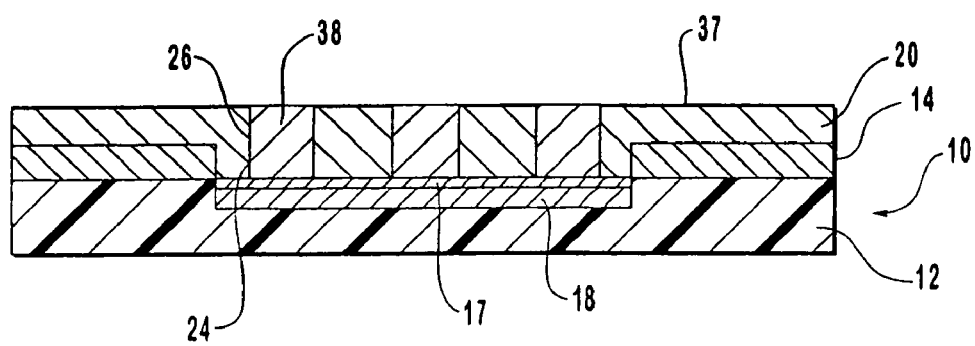
FIG. 6 is a cross-sectional elevation view of the silicon wafer in FIG. 5 having a planarized surface to form silicon plugs filling the diode trenches.

In a preferred embodiment, chemical-mechanical polishing is next used to remove a portion of amorphous silicon layer 36 such that insulation layer 20 is exposed. As shown in FIG. 6, this step results in layered wafer 10 having an exposed planarized surface 37. Furthermore, each diode trench 24 is left being filled with a silicon plug 38. Silicon plug 38 contacts refractory metal silicide layer 17 at floor 28 (see FIG. 4) and is bounded by insulation layer 20 at side walls 26. Chemical-mechanical polishing is the preferred method for removing amorphous silicon layer 36 since it eliminates the need for masking. Alternatively, photoresist etchback can be used for partial removal of amorphous silicon layer 36.

Amorphous silicon has a higher current leakage than either polysilicon or epitaxial silicon. To minimize leakage, one embodiment of the preferred invention recrystallizes the amorphous silicon into substantially large grain polysilicon after the amorphous silicon is deposited.

Amorphous silicon recrystallizes into large grains of polysilicon when it is exposed to elevated temperatures in a range between about 550° C. to about 650° C. over a period of time. In general, the crystal grain size increases as the exposure time increases at a constant temperature. As the size of the grains increase, the surface area of the grains decrease per unit volume. Accordingly, the number of boundary layers between the grains also decrease per unit volume. As the grain boundaries decrease, the current leakage decreases. Time and energy required for recrystallization, however, increases manufacturing costs.

To optimize the above factors, the amorphous silicon is preferably heated at a temperature ranging from about 450° C. to about 550° C. with about 500° C. to about 530° C. being more preferred. The amorphous silicon is preferably exposed to the above temperatures for a period of time ranging from about 18 hours to about 48 hours with about 18 hours to about 30 hours being more preferred. As a result, the amorphous silicon is converted to a polysilicon preferably having an average grain size ranging from about 0.3 microns to about 0.8 microns with about 0.4 microns to about 0.6 microns being more preferred.

In the preferred embodiment, the amorphous silicon is heated in a hydrogen rich environment. The hydrogen fills the dangling bonds at the grain boundaries, thereby helping to anneal the grains together. In turn, annealing of the grains helps to further decrease the current leakage.

To further optimize the effect of increasing the size of the silicon grains, it is also preferred to minimize the width, designated by the letter "w" in FIG. 5, of diode trench 24. That is, by minimizing the width "w" of diode trench 24, the number of grains needed to fill diode trench 24 is also decreased, thereby decreasing the number of grain boundaries. In part, however, the width "w" of diode trench 24 is limited by the required current needed to pass through the diode for programming. As a result, diode trench 24 preferably has a width in a range between about 0.3 microns to about 0.8 microns with about 0.4 microns to about 0.6 microns being more preferred.

Formation of the large grain polysilicon is preferably accomplished directly after deposition of amorphous silicon layer 36 but, as in an alternative process, can be performed after chemical-mechanical polishing of amorphous silicon layer 36.

Figure 7:
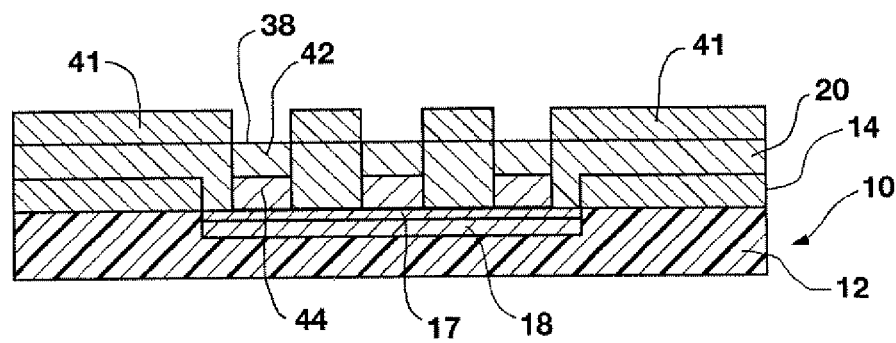
FIG. 7 is a cross-sectional elevation view of the silicon wafer in FIG. 6 wherein each of the silicon plugs comprises a top portion doped with a first type dopant and a bottom portion doped with a second type dopant.

Once silicon plug 38 is formed and exposed as discussed above, a photoresist layer 41 is positioned over planarized surface 37, as shown in FIG. 7. Photoresist layer 41 is patterned to independently expose silicon plug 38. Ion implantation is then used to heavily dope a top portion 42 of silicon plug 38 with the first type dopant. Photoresist layer 41 is then removed. As a result of the above step, silicon plug 38 comprises top portion 42 which is separated from refractory metal silicide layer 17 by a bottom portion 44. Bottom portion 44 is identified as the portion of silicon plug 38 that was not subjected to the ion implantation of the first type of dopant. As such, bottom portion 44 is still lightly doped with the second type of dopant.

After the ions from the first type of dopant have been implanted into top portion 42 of silicon plug 38, the dopant must be activated. In the preferred embodiment, the dopant is activated using RTP. The RTP cycle preferably heats top portion 42 to a temperature in a range between about 950° C. to about 1100° C., over a time period between about 5 seconds to about 20 seconds. Other conventional annealing processes can also be used to activate the dopant.

Figure 8:
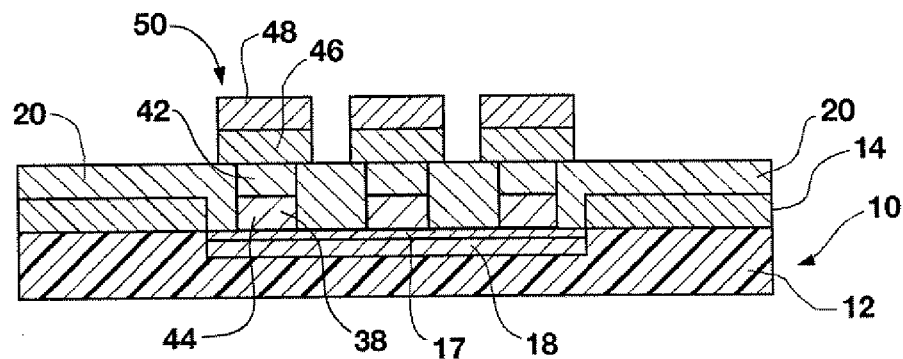
FIG. 8 is a cross-sectional elevation view of the silicon wafer in FIG. 7 having a programmable resistor and a metal contact.

In one embodiment incorporating features of the present invention, the inventive diode can be used as a memory device. In this embodiment, as shown in FIG. 8, a programmable resistor 46 is next positioned over and in contact with top portion 42 of silicon plug 38. As used in the specification and appended claims, the term "programmable resistor" defines a plurality of alternatively stacked layers of memory material, such as ovonic or chalcogenide, and barrier material, such as titanium nitride. In the preferred embodiment, there is a layer of chalcogenide material surrounded by two to five layers of barrier material.

As is well known in the art, chalcogenides are materials that may be electrically stimulated to change states and resistivities, from an amorphous state to a crystalline state, for example, or to exhibit different resistivities while in a crystalline state. A chalcogenide material may be predictably placed in a particular resistivity state by, for example, running a current of a certain amperage through it. The resistivity state so fixed will remain unchanged unless and until a current having a different amperage within the programming range is run through the chalcogenide material.

A metallization step forms a metal contact 48, as shown in FIG. 8, in contact with programmable resistor 46 to form a vertical diode 50. Metal contact 48 is formed using the same steps as discussed above, namely, deposition, masking, and etching.

Figure 8A:
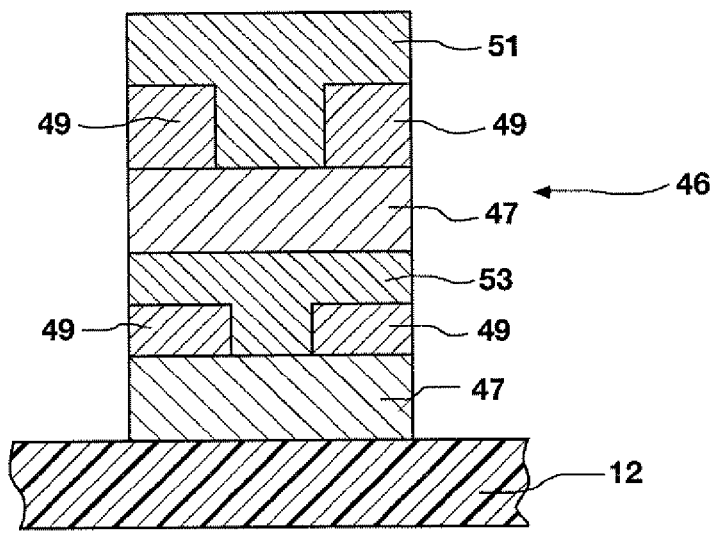
FIG. 8A is an enlarged side view of the programmable resistor in FIG. 8 and a diode combination.

FIG. 8A discloses one embodiment of programmable resistor 46 situated on a silicon wafer 12 with a layer of carbon or titanium nitride layer 47 superadjacent to silicon wafer 12. Situated upon carbon or titanium nitride layer 47 is a layer 49 of SiN, and a layer 53 of chalcogenide material. Over layer 53 is another layer 47 of carbon or titanium nitride, and upon that layer 47 is another layer 49 of SiN. Finally, a metal layer 51 is situated upon the top most layer 49 which is also composed of SiN. Metal layer 51 also makes contact through a contact hole in lower layer 49 with top most layer 47. Layer 53 also makes contact through a contact hole in lower layer 49 with lower layer 47.

Figure 9:
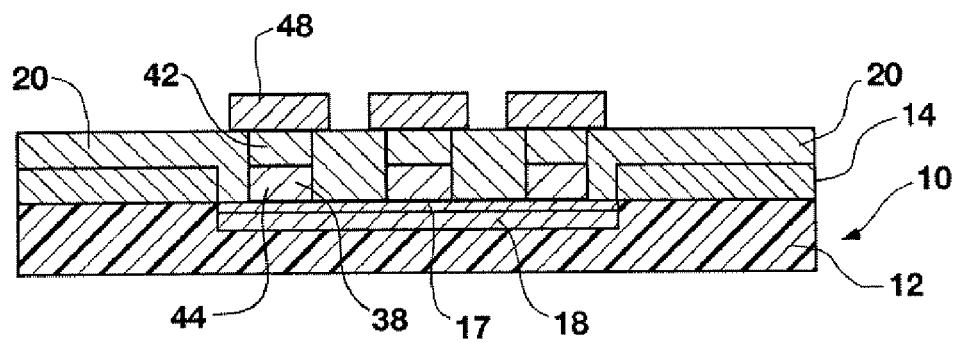
FIG. 9 is a cross-sectional elevation view of the silicon wafer in FIG. 8A without the programmable resistor material.

In one alternative embodiment of the present inventive diode, programmable resistor 46 can be removed. In this embodiment, as shown in FIG. 9, metal contact 48 is secured directly to top portion 42 of silicon plug 38.

In yet another alternative embodiment, resistance through the inventive diode is decreased by lining diode trench 24 with a second refractory metal silicide layer. As disclosed above with regard to vertical diode 50, top portion 42 is heavily doped with the first type dopant. The use of a heavily doped top portion 42 of a diode, as opposed to a standard doping, increases the rate of current flow through the diode in the forward bias direction. As a result of having a heavily doped top portion 42, however, bottom portion 44 of the diode must be lightly doped so as to limit current leakage in the reverse bias direction. In general, a lighter doping will decrease the current leakage. As the dosage decreases, however, the resistance also increases. It is therefore desirable to design a structure that decreases the resistance through bottom portion 44 without increasing leakage.

Figure 10:
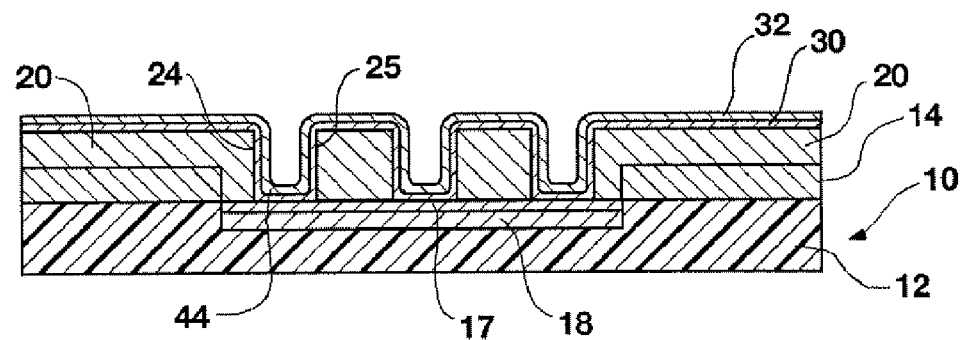
FIG. 10 is a cross-sectional elevation view of the silicon wafer shown in FIG. 6 having a polysilicon layer and a refractory metal layer.

As depicted in FIG. 10, after diode trench 24 is formed, as previously discussed with regard to FIG. 4, but before amorphous silicon layer 36 is deposited, a sacrificial polysilicon layer 30 is deposited on layered wafer 10. Polysilicon layer 30 is deposited with good step coverage on interior surface 25 of diode trench 24. Deposition of polysilicon layer 30 is performed using conventional methods such as sputtering or chemical vapor deposition. It is preferred that polysilicon layer 30 be deposited in a thickness ranging between about 200 Angstroms to about 500 Angstroms.

As also shown in FIG. 10, once polysilicon layer 30 is deposited, a refractory metal layer 32 is subsequently deposited over polysilicon layer 30. Refractory metal layer 32 preferably has a thickness ranging from about 500 Angstroms to about 1000 Angstroms. Deposition of refractory metal layer 32 may be accomplished by sputtering, chemical vapor deposition, or most other processes by which metals are deposited. Refractory metal layer 32 is preferably formed of titanium (Ti), however, other refractory metals such as tungsten (W), tantalum (Ta), cobalt (Co), and molybdenum (Mo) can also be used.

Figure 11:
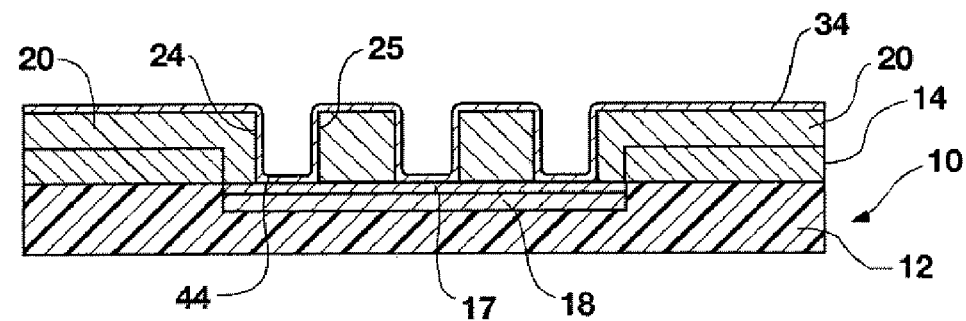
FIG. 11 is a cross-sectional elevation view of the silicon wafer in FIG. 10 wherein the polysilicon layer and the refractory metal layer are converted to a single silicide layer.

Next, polysilicon layer 30 and refractory metal layer 32 are sintered so as to react together and form a single refractory metal silicide layer 34 as shown in FIG. 11. Refractory metal silicide layer 34 has a relatively low contact resistance and is positioned so as to line interior surface 25 of diode trench 24. The composition of refractory metal silicide layer 34 is dependent on the refractory metal used. Where Ti is used, refractory metal silicide layer 34 is $TiSi_2$. Other silicides that can be formed include, by way of example, $WSi_2$, $TaSi_2$, $CoSi_2$, and $MoSi_2$.

The sintering step is performed at a temperature ranging from about 500° C. to about 700° C., and an exposure time ranging between about 5 seconds to about 20 seconds. Conventional heat treating processes, such as RTP, can be used for the sintering. In the preferred embodiment, however, the heating does not need to be performed in a nitrogen-rich atmosphere since planarization will be performed using chemical-mechanical polishing.

Figure 12:
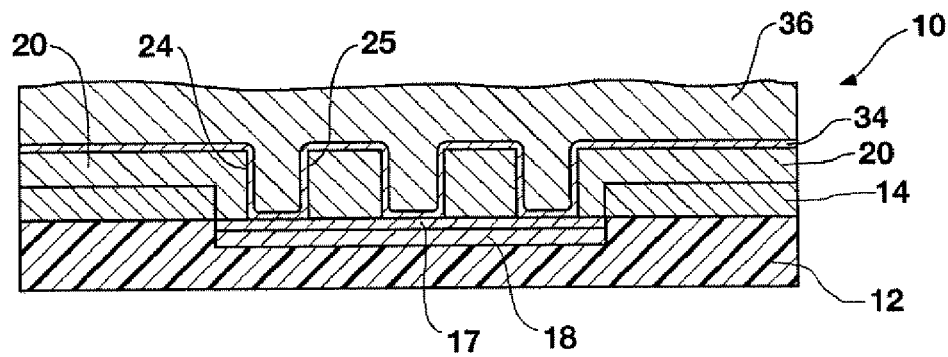
FIG. 12 is a cross-sectional elevation view of the silicon wafer in FIG. 11 having a layer of amorphous silicon.
Figure 13:
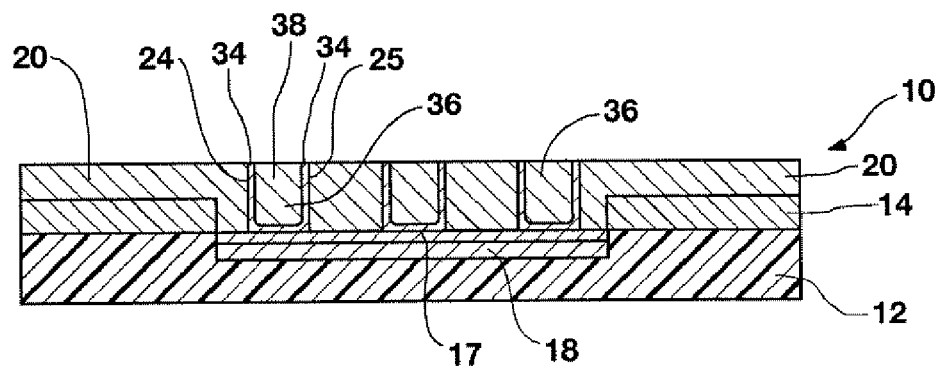
FIG. 13 is a cross-sectional elevation view of the silicon wafer in FIG. 12 after planarization.

Once refractory metal silicide layer 34 is formed, amorphous silicon layer 36 is deposited, as shown in FIG. 12, over refractory metal silicide layer 34. Amorphous silicon layer 36 is deposited in the same manner as discussed with regard to FIG. 5 and thus fills diode trench 24. Using the same process steps as discussed with regard to FIG. 6, chemical-mechanical polishing is used to remove the portion of amorphous silicon layer 36 and refractory metal silicide layer 34 above planarized surface 37 of insulation layer 20. The resulting configuration, as disclosed in FIG. 13, shows silicon plug 38 being housed within diode trench 24 and lined by refractory metal silicide layer 34.

Using the same method as previously discussed, the amorphous silicon used in amorphous silicon layer 36 and housed within diode trench 24 is heated to form large grain polysilicon. The preferred size of diode trench 24 and the average diameter grain size of the polysilicon are substantially as previously disclosed.

Figure 14:
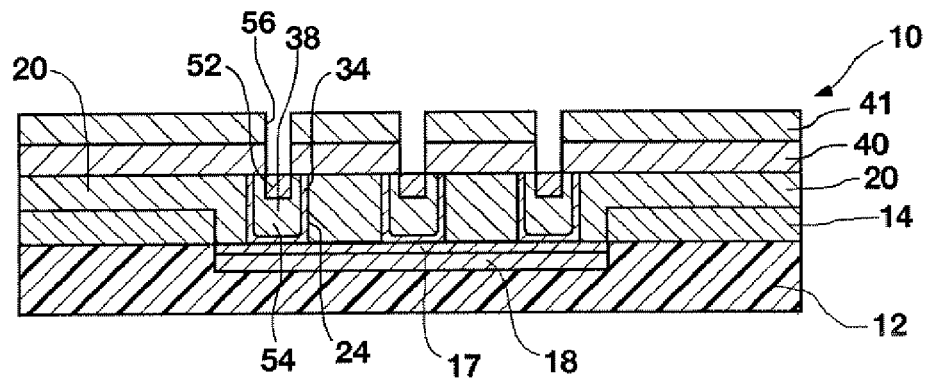
FIG. 14 is a cross-sectional elevation view of the silicon wafer in FIG. 13 having an oxide layer and a photoresist layer each having a channel positioned therethrough to each of a plurality of silicon plugs, each of the silicon plugs having a top portion and a bottom portion.

With portions of amorphous silicon layer 36 removed, a protective and insulative silicon layer 40 is deposited, as shown in FIG. 14, in a blanket over layered wafer 10 so as to span diode trench 24. Insulative silicon layer 40 can be composed of either silicon dioxide or silicon nitride. Silicon layer 40 is preferably deposited in the same manner as discussed with insulation layer 20.

Shown positioned on top of silicon layer 40 is a photoresist layer 41. Photoresist layer 41 is patterned to mask silicon layer 40 so that conventional etching can be performed to produce a passageway 56 that extends through silicon layer 40 and exposes silicon plug 38 within diode trench 24. Passageway 56 preferably has a width smaller than the width of silicon plug 38 and is centrally aligned on silicon plug 38 so as not to expose or contact refractory metal silicide layer 34.

Silicon plug 38 is then heavily doped through passageway 56 with the first type of dopant to form a top portion 52 of silicon plug 38, as shown in FIG. 14. Silicon plug 38 is thus shown as comprising a U-shaped bottom portion 54 being lightly doped with the second type of dopant. Top portion 52 is bounded within bottom portion 54 and is heavily doped with the first type of dopant. Top portion 52 is formed in the same method as discussed with respect to the formation of top portion 42 in FIG. 7. The difference between top portion 52 and top portion 42 is that top portion 52 must be bounded by bottom portion 54 so as not to contact refractory metal silicide layer 34.

Figure 15:
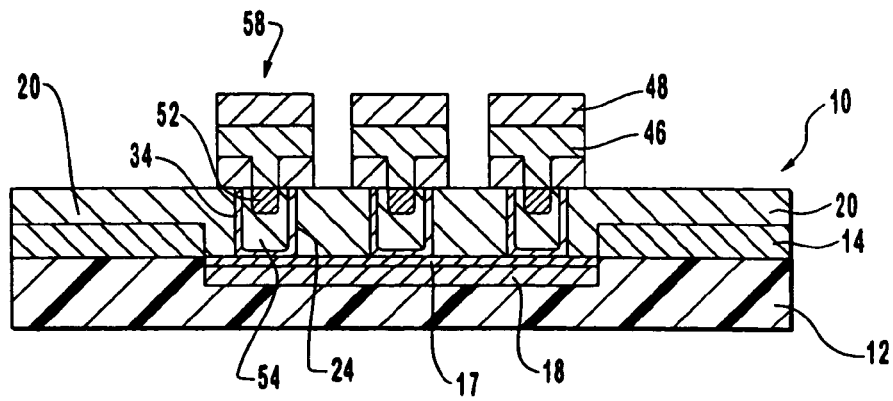
FIG. 15 is a cross-sectional elevation view of the silicon wafer in FIG. 14 having a programmable resistor and a metal contact.

Using substantially the same methods as discussed with regard to FIG. 8, a programmable resistor 46 is deposited over silicon layer 40 and within passageway 56 so as to contact top portion 52 of silicon plug 38. Finally, a metal contact 48 is positioned on programmable resistor 46 to complete a vertical diode 58 incorporating features of the present invention, as shown in FIG. 15. As previously discussed however, programmable resistor 46 can be eliminated if desired so that metal contact 48 directly contacts top portion 52 of silicon plug 38.

By lining diode trench 24 with refractory metal silicide layer 34, the area of lightly doped bottom portion 54 is minimized. In turn, minimizing bottom portion 54 decreases the resistance through vertical diode 58. The resistance is further decreased by the fact that the current flows through refractory metal silicide layer 34 which has an extremely high conductance and, thus, low resistance.

Figure 16:
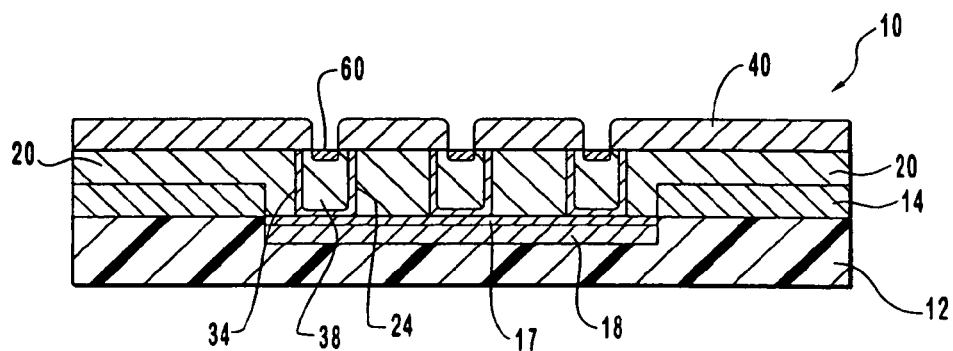
FIG. 16 is a cross-sectional elevation view of the silicon wafer in FIG. 14 having a metal deposited on each of the silicon plugs.

In yet another alternative embodiment, Schotkky diode can be formed incorporating features of the present invention. In general, Schotkky diode is formed by placing a metal in contact with a lightly doped region. To accomplish this, rather than doping silicon plug 38 to form top portion 52, as discussed with regard to FIG. 14, a platinum silicide (PtSi$_2$) layer 60 is formed on the exposed surface of silicon plug 38, as shown in FIG. 16. Platinum silicide layer 60 is formed using the same methods as discussed in the formation of refractory metal silicide layer 34. Namely, a layer of sacrificial polysilicon is deposited over silicon plug 38. A layer of platinum is then deposited over the sacrificial polysilicon. Sintering is then used to form the PtSi$_2$. In an alternative embodiment, other refractory metals, such as those previously discussed with regard to refractory metal silicide layer 34, can replace the platinum and thus form alternative silicides.

Figure 17:
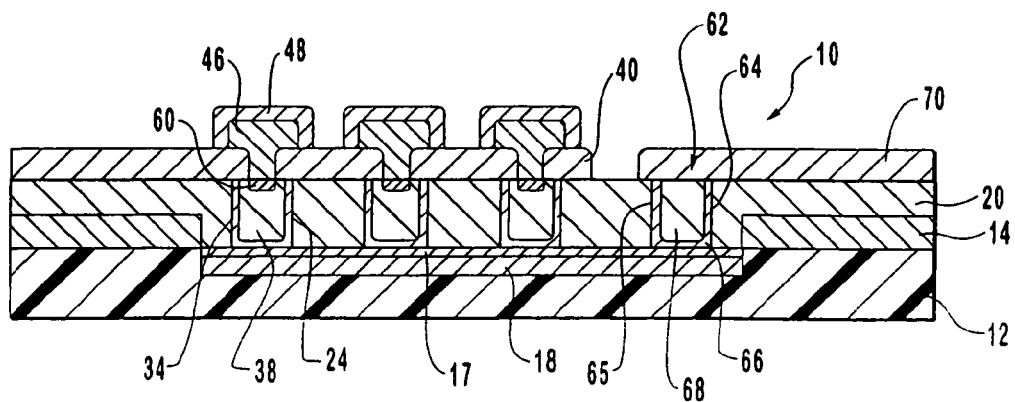
FIG. 17 is a cross-sectional elevation view of the silicon wafer in FIG. 16 having a programmable resistor and metal contact and further showing a connection plug for delivering electricity to the inventive diodes.

An aqua regia process is next used to remove the non-reactive platinum. As shown in FIG. 17, the diode can then be finished by selectively attaching a programmable resistor 46 and a metal contact 48 as previously discussed.

As also shown in FIG. 17, to deliver a current to the above-disclosed inventive diodes, a connection plug 62 is formed through insulation layer 20 so as to contact refractory metal silicide layer 17. Connection plug 62 is formed by initially etching a connection trench 64 having an interior surface 65 through insulation layer 20. Connection trench 64 has substantially the same configuration as diode trench 24 and is preferably formed at the same time and in the same manner as diode trench 24. The formation of diode trench 24 is as discussed with regard to FIG. 4.

Next, a titanium layer 66 is deposited on interior surface 65 of connection trench 64. Titanium layer 66 is deposited in the same manner, as discussed with regard to FIG. 10, that refractory metal layer 32 is deposited over polysilicon layer 30. In one embodiment, titanium layer 66 is exposed to a nitrogen-rich environment at an elevated temperature to convert the titanium to titanium nitride (TiN). Next, the connection trench 64 is filled with tungsten (W), using a deposition process, to form a tungsten plug 68.

Finally, a metal contact 70, preferably made of aluminum, is positioned to contact tungsten plug 68. In this configuration, an electrical current delivered to metal contact 70, travels through connection trench 64 and along active region 18 where it enters each of the connected diodes.

Figure 18:
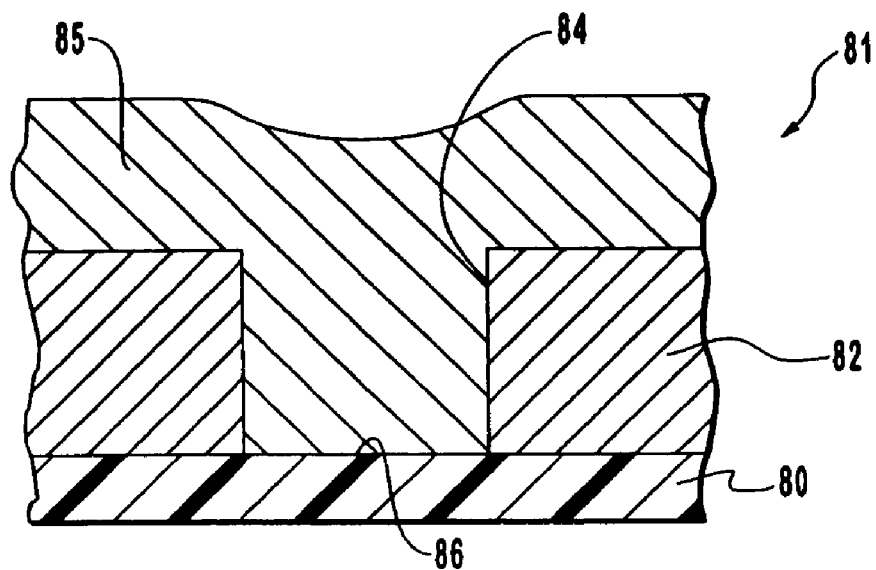
FIG. 18 is a cross-sectional elevation view of an alternative embodiment of a silicon wafer having an oxide layer and polysilicon layer.

The present invention also discloses other embodiments of vertical diodes that minimize resistance and current leakage. For example, an additional embodiment of a vertical diode incorporating features of the present invention is disclosed in FIGS. 18 and 19. As disclosed in FIG. 18, a silicon substrate 80 of a silicon wafer 81 has been overlaid by an oxide layer 82. Silicon substrate 80 is lightly doped with a first type dopant that is preferably a P-type dopant. Alternatively, of course, silicon substrate 80 can be doped with an N-type dopant. A conventional masking and etching process has been used to form a hole 84 through oxide layer 82 to expose a surface 86 of silicon substrate 80.

Figure 19:
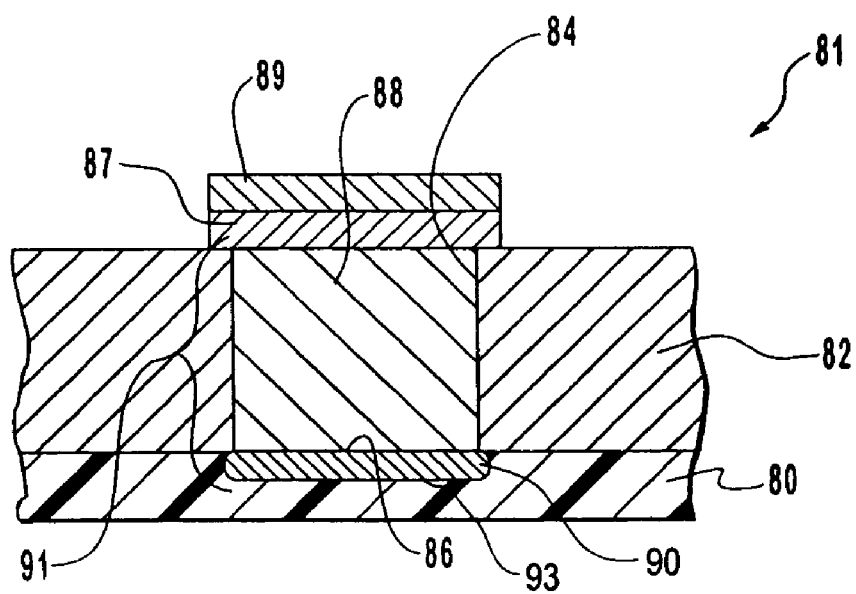
FIG. 19 is a cross-sectional elevation view of the silicon wafer in FIG. 18 having an active region formed by dopants diffused from the polysilicon layer.

A polysilicon layer 85 has been deposited in a blanket layer over silicon wafer 81 so as to fill hole 84. Polysilicon layer 85 is deposited in an open or closed deposition tube so as to simultaneously be heavily doped with a second type dopant. As shown in FIG. 19, a CMP or other planarizing step has been used to remove the portion of polysilicon layer 85 above oxide layer 82. As a result, a silicon plug 88 is formed within hole 84.

Next, silicon wafer 81 is heated to an elevated temperature, such as by using an RTP or tube furnace step, so as to diffuse a portion of the doping ions from polysilicon plug 88 into silicon substrate 80, thereby forming an active region 90. The benefit conferred in doping by diffusion is that such doping allows for shallow junction formation. Preferred process flow parameters for diffusion of the doping ions are a heat cycle of 30 minutes at 900° C. in an atmosphere of gaseous diatomic nitrogen within a batch processing tube furnace. As a result, a vertical diode 91 is formed having a junction 93 formed at the interface of active region 90 and silicon substrate 80. If desired, a programmable resistor 87 and a metal contact 89 can be formed over polysilicon plug 88 in substantially the same way that programmable resistor 46 and metal contact 48 are formed over silicon plug 38 in FIG. 17.

In the above embodiment, junction 93 is formed within the single crystal structure of silicon substrate 80 and thus has relatively low resistance and low current loss. One problem with this configuration, however, is that the dopants migrating from polysilicon plug 88 into silicon substrate 80 migrate both vertically and laterally. Accordingly, as shown in FIG. 19, active region 90 has a larger diameter than hole 84. This increase in size of active region 90 can create isolation problems when attempting to densely compact a plurality of vertical diodes 91 in a defined area. More specifically, if the adjacent diodes are formed too close together, a short can occur between adjacent active regions 90 as a voltage is applied to the diodes. To prevent shorts, the diodes must be placed further apart, thereby decreasing their formation density.

To remedy this isolation problem, the present invention also discloses inventive diode configurations that maximize compaction and minimize the possibility of shorting. The method for forming the below alternative embodiment of an inventive diode is discussed as part of an integrated system for simultaneously forming a plurality of memory-capable diodes that have low series resistance. It is submitted, however, that those skilled in the art would be able to use the present disclosure to construct and use the diode portion of the system in any environment where a diode is needed.

Figure 20:
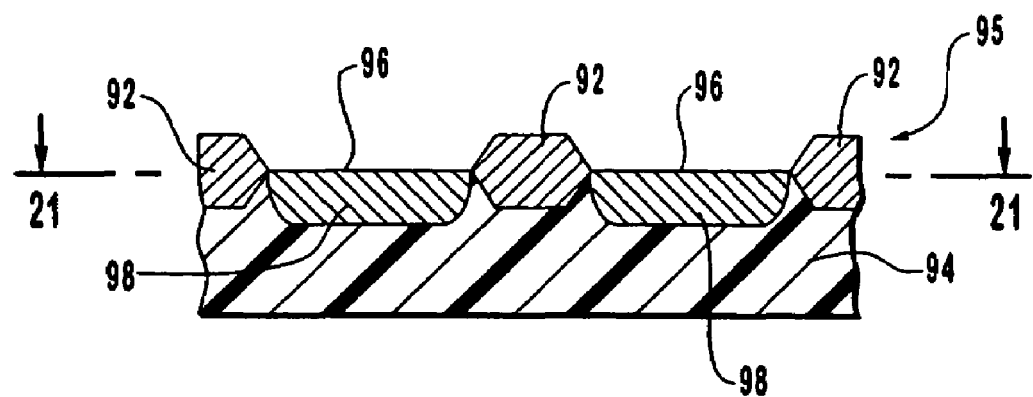
FIG. 20 is a cross-sectional elevation view of another alternative embodiment of a silicon wafer having a pair of active regions separated by field oxide regions.

As shown in FIG. 20, the first step in formation of the inventive diode is to use a local oxidation of silicon (LOCOS) process to grow a series of field oxide regions 92 on a silicon substrate 94 of a silicon wafer 95. Silicon substrate 94 was initially doped with an N-type dopant and has a series of exposed surfaces 96 positioned between each adjacent field oxide region 92. Next, each exposed surface 96 is lightly doped by ion implantation with P-type dopants to form active regions 98. The configuration shown in FIG. 20 in which two active regions 98 and three field oxide regions 92 are shown is simply illustrative. In practice, any number of active regions 98 and field oxide regions 92 can simultaneously be formed on silicon wafer 95.

Figure 21:
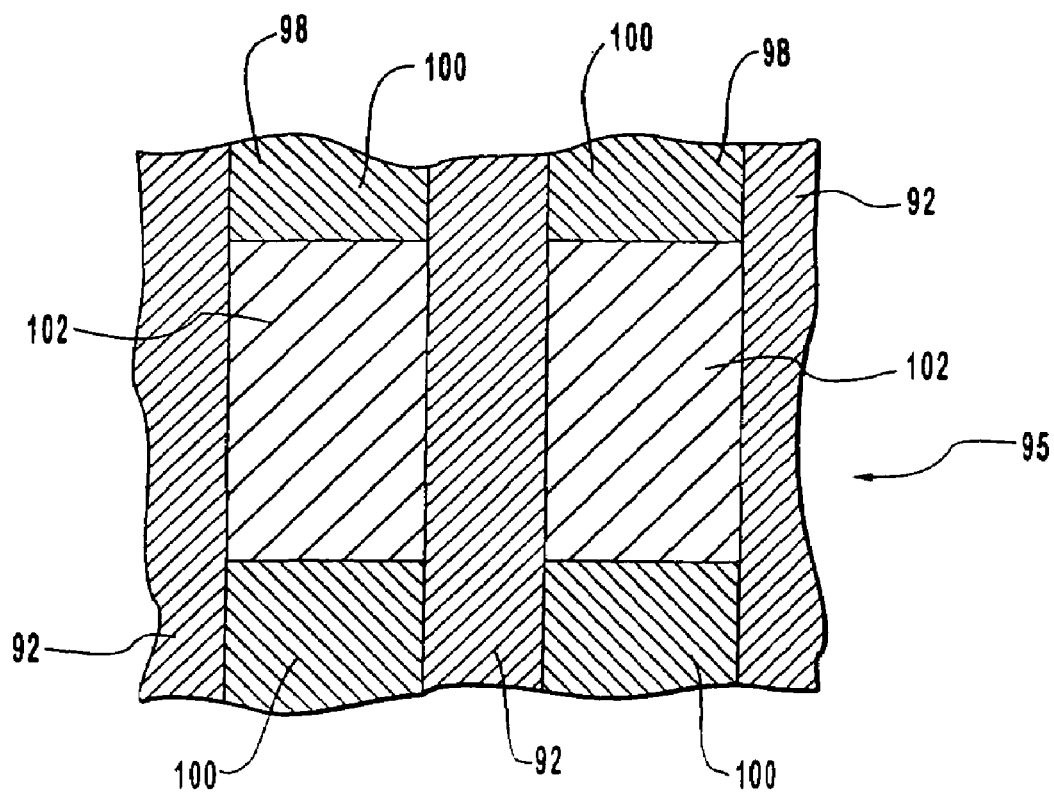
FIG. 21 is a top plan view of the silicon wafer shown in FIG. 20.

FIG. 21 is a top view of a section of silicon wafer 95 showing the elements described above in FIG. 20. As shown in FIG. 21, field oxide regions 92 and active regions 98 each have a length extending along the surface of silicon wafer 95. As will be discussed later in greater detail, active regions 98 act as digit lines that communicate with discrete diodes formed on active region 98. Once all of active regions 98 are doped, alternating line portions of regions 98 are heavily doped with a P-type dopant. This is accomplished by using a layer of photoresist to initially cover active regions 98. A conventional masking and etching process is then used to expose those portions of active regions 98 that are to be heavily doped. Ion implantation is then used to dope the exposed areas. With the layer of photoresist removed, FIG. 21 shows active regions 98 as comprising alternating P-plus active regions 100 and P-minus active regions 102.

Figure 22:
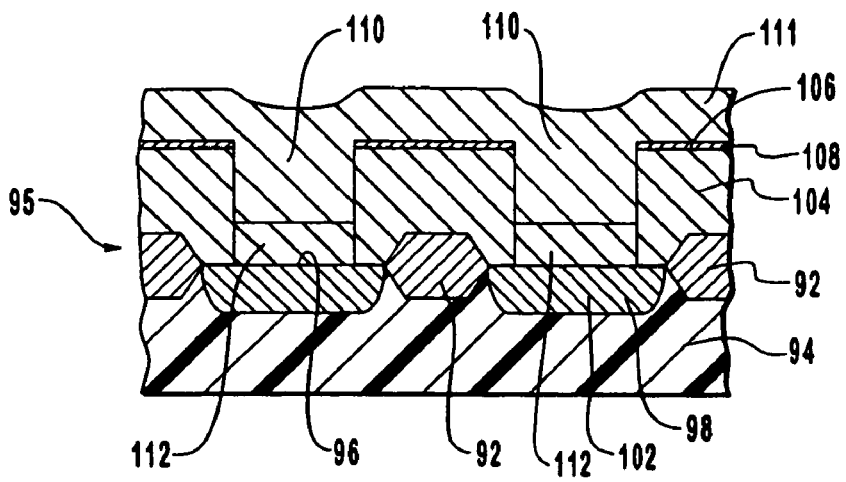
FIG. 22 is a cross-sectional elevation view of the silicon wafer shown in FIG. 20 having an epitaxial silicon layer and a polysilicon layer.

FIG. 22 is a cross-sectional view of silicon wafer 95 taken across P-minus active region 102. As shown therein, a blanket oxide layer 104 has been deposited over silicon wafer 95. As used in the specification and appended claims, the term "oxide layer" is interpreted to include a layer made out of any insulative silicon material, e.g., silicon monoxide, silicon dioxide, and silicon nitride. Chemical-mechanical polishing (CMP) or some other equivalent process has also been used to planarize oxide layer 104 so as to form a smooth top surface 106. Deposited on top of top surface 106 is a silicon nitride layer 108 that can also be subjected to a CMP process. As will be discussed later, silicon nitride layer 108 functions as an etch stop for later processing.

A conventional masking and etching process has next been used to form holes 110 that extend through silicon nitride layer 108, oxide layer 104, and exposed surface 96 of P-minus active regions 102. With holes 110 formed, silicon wafer 95 is positioned in a reactor chamber and an epitaxial silicon layer 112 is grown exclusively on exposed surface 96 of P-minus active regions 102. Epitaxial silicon layer 112 is lightly doped during growth with a P-type dopant. The growing of epitaxial silicon is both a time consuming and expensive process. As such, it is preferable to minimize the thickness of epitaxial silicon layer 112 so as to minimize the amount of epitaxial silicon that needs to be grown. As discussed in greater detail below, however, epitaxial silicon layer 112 must be sufficiently thick to enable the formation of a junction for the inventive diode. As such, it is preferable that epitaxial silicon layer 112 have a thickness in a range between about 1500 Angstroms to about 3000 Angstroms, with about 2000 Angstroms to about 2500 Angstroms being more preferred. Methods for forming epitaxial silicon layer 112 are known in the art, but a preferred method for the forming is at a temperature of 950° C. to 1200° C. in an atmosphere of silane, $SiH_2Cl_2$, or disilane, and the deposition method is LPCVD at 1000 Angstroms per minute. Alternatively, atmospheric pressure deposition can also be employed.

Figure 22A:
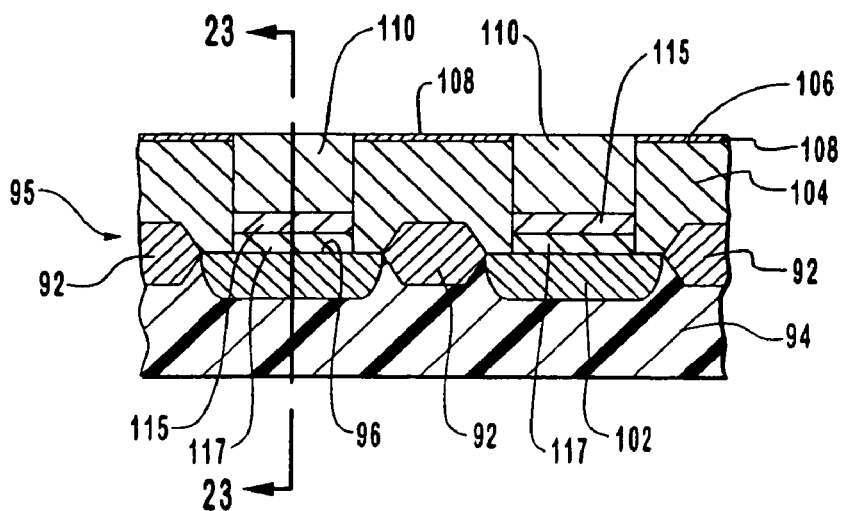
FIG. 22A is a cross-sectional elevation view of the silicon wafer shown in FIG. 22 wherein the epitaxial silicon layer has been doped by diffusion from the polysilicon layer.

Next, a polysilicon layer 111 has been deposited over silicon wafer 95 so as to fill the remaining portion of each hole 110. Polysilicon layer 111 is heavily doped during deposition with an N-type dopant. A CMP process is then used to planarize polysilicon layer 111 down to silicon nitride layer 108. As a result, FIG. 22, 22A and 23 show contact holes 110 being filled with lightly P-doped epitaxial silicon layer 112 contacting P-minus active regions 102 and an N-doped polysilicon plug 114 positioned on top of epitaxial silicon layer 112.

Silicon wafer 95 is next heated to an elevated temperature, such as by using an RTP process, sufficient to cause a portion of the N-type dopants in polysilicon plug 114 to diffuse into a top portion 115 of epitaxial silicon layer 112. As such, a diode is formed having a junction 123, defined by the interface between a top portion 115 and a bottom portion 117 of epitaxial silicon layer 112. Top portion 115 is defined by the area that is N doped by the ions diffused from polysilicon plug 114. Bottom portion 117 is the remaining area of epitaxial silicon layer 112. As a result of epitaxial silicon layer 112 having a single crystal structure, current leakage and resistance is minimized at junction 123. Furthermore, since junction 123 is isolated within hole 110, similarly constructed diodes can be formed closer together at increased density without fear of shorting.

Figure 23:
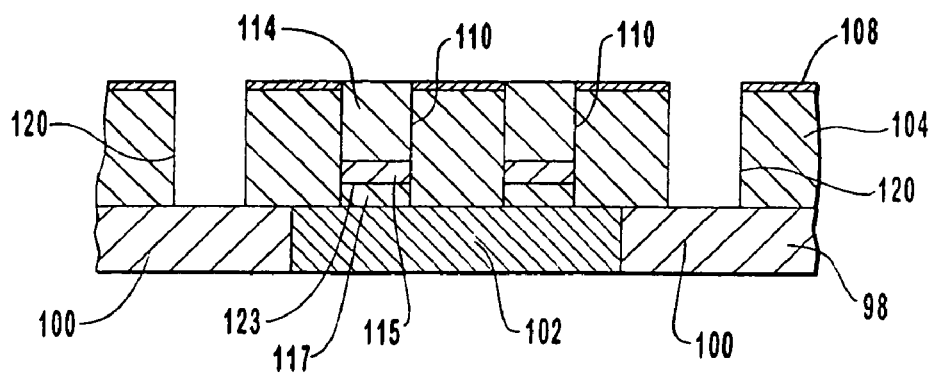
FIG. 23 is a side cross-sectional elevation view of the silicon wafer in FIG. 22A showing the formation of a pair of adjacent diodes.
Figure 24:
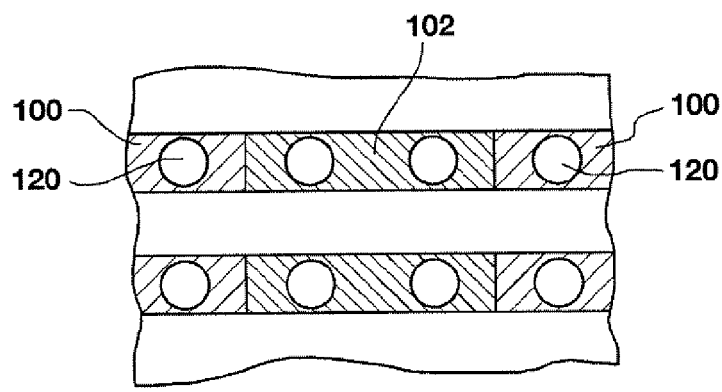
FIG. 24 is a top plan view of the silicon wafer in FIG. 23.
Figure 25:
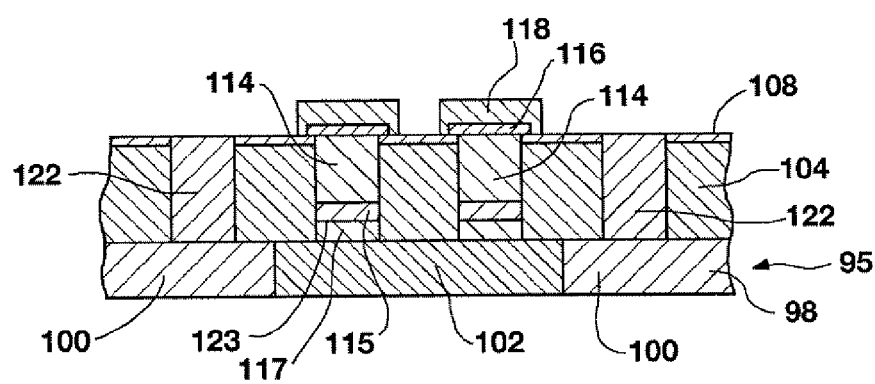
FIG. 25 is a cross-sectional elevation view of the silicon wafer shown in FIG. 23 having a programmable resistor and metal contact positioned at the top of each diode.

FIG. 23 is a cross-sectional view taken along the length of one line of active regions 98. In the preferred embodiment, as shown in FIG. 23 and the corresponding top view in FIG. 24, two adjacent holes 110 are simultaneously formed within P-minus active regions 102 according to the above process. As such, two vertical diodes can simultaneously be formed. Likewise, after each polysilicon plug 114 is formed, a conventional masking and etching process can be used to form a hole 120 in each of P-plus active regions 100 on opposing sides of P-minus active regions 102. Holes 120 extend through silicon nitride layer 108 and oxide layer 104 and expose P-plus active regions 100. As shown in FIG. 25, a polysilicon layer is then deposited over silicon wafer 95 so as to fill each of holes 120 (see FIG. 24). The polysilicon layer is heavily doped during deposition with a P-type dopant. A CMP process is then used to remove the portion of the polysilicon layer above silicon nitride layer 108 so that polysilicon plugs 122 are formed filling contact holes 120.

Once polysilicon plugs 122 are formed, a programmable resistor 116 can be formed in contact with polysilicon plug 114 in the same manner that programmable resistor 46 is formed in contact with polysilicon plug 38 in FIG. 8. After programmable resistors 116 are formed, metal row lines 118 are formed that span between active regions 98 to cover and contact aligned programmable resistors 116. Metal row lines 118 are formed by initially depositing a metal layer over silicon wafer 95 so as to cover programmable resistors 116. A layer of photoresist is next deposited over the metal layer. A conventional masking and etching process is used to remove the unwanted portion of the metal layer so that only the metal row lines 118 connecting and covering programmable resistors 116 remain. The remaining photoresist material is then removed.

Figure 25A:
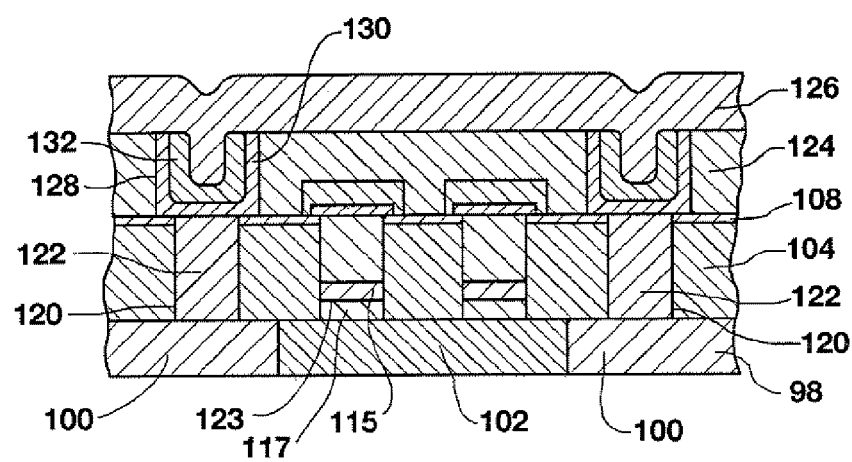
FIG. 25A is a cross-sectional elevation view of the silicon wafer in FIG. 25 showing a strapping configuration over the diodes.

In FIG. 25A, a blanket oxide layer 124 is deposited over silicon wafer 95 so as to cover metal row lines 118. A CMP step is used to planarize oxide layer 124 so that a smooth surface 126 is obtained. To access polysilicon plugs 122, a layer of photoresist is deposited over surface 126. Masking and etching steps are then used to form channels 128 extending through oxide layer 124 and down to polysilicon plugs 122. Channel 128 has a diameter slightly larger than the diameter of contact hole 120 so that a portion of silicon nitride layer 108 is exposed.

A conductive material, such as any conventional metal, is next deposited in a blanket layer to fill channels 128 and interconnect polysilicon plugs 122 on opposing sides of the vertical diodes. This is preferably accomplished by depositing a titanium layer 130, or other refractory metal, by the process of sputtering so that a thin layer is formed on the interior surface of contact hole 120. Next, a layer 132 of tungsten is deposited by CVD methods so that a thin layer is deposited over layer 130. Layer 130 is composed of TiN, titanium, or both TiN and titanium. A CMP step, or an etchback dry etch step, is then used to remove layer 130 and tungsten layer 132 that is not within contact hole 120. Finally, a blanket layer of tungsten is deposited over silicon wafer 95 so as to fill the remaining area within channel 128, thereby providing strapping over the vertical diodes.

Figure 26:
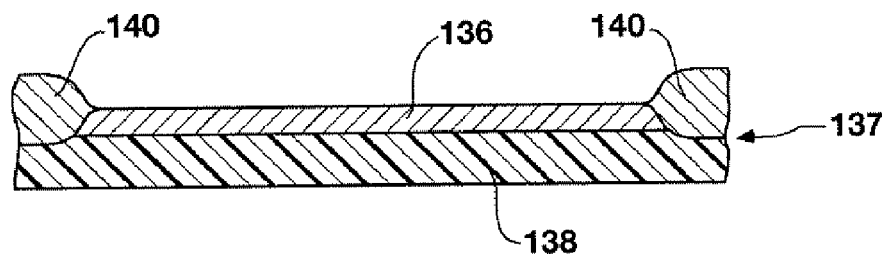
FIG. 26 is a cross-sectional elevation view of an alternative embodiment of a silicon wafer having an active region.

The present invention also discloses other embodiments of low series resistance, vertical diodes that incorporate strapping. In one such embodiment, as shown in FIG. 26, vertical diodes are formed on a silicon wafer 137 by initially lightly implanting a P-type dopant in an N-doped silicon substrate 138 to form an active region 136. Active region 136 comprises a digit line that is bounded on opposing sides by field oxide 140.

Figure 27:
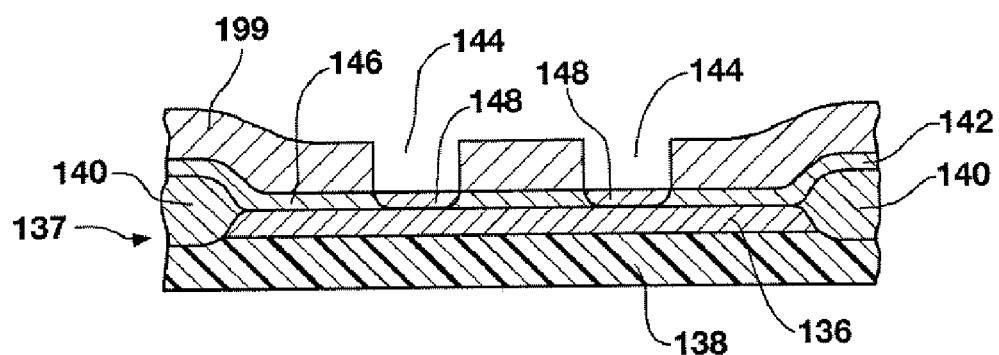
FIG. 27 is a cross-sectional elevation view of the silicon wafer in FIG. 26 having a doped polysilicon layer positioned thereon.

As shown in FIG. 27, a polysilicon layer 142 is next deposited in a blanket layer over silicon wafer 137. Polysilicon layer 142 is heavily doped by ion implantation with an N-type dopant. A photoresist layer 199 is next deposited over polysilicon layer 142 and field oxide 140. Conventional masking and etching steps are then used to form holes 144 through photoresist layer 199 that expose select portions of polysilicon layer 142. P-type dopants are then implanted through holes 144 so as to heavily dope portions of polysilicon layer 142. As such, polysilicon layer 142 is shown as having heavily N-doped regions 146 and heavily P-doped regions 148.

Figure 28:
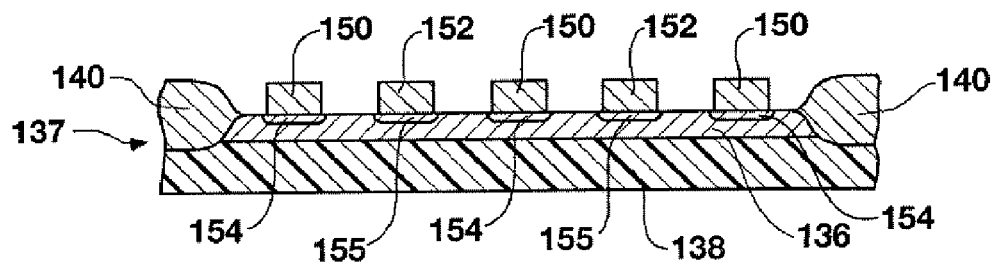
FIG. 28 is a cross-sectional elevation view of the silicon wafer in FIG. 27 having a plurality of oppositely doped columns.

Once photoresist layer 199 has been removed, an additional photolithography step is used to selectively remove portions of polysilicon layer 142 so that a plurality of heavily N-doped columns 150 and heavily P-doped columns 152, corresponding respectively to N-doped regions 146 and P-doped regions 148, project from active region 136. Silicon wafer 137 is next heated to an elevated temperature, such as by an RTP step, so as to partially diffuse the dopant ions within columns 150 and 152 into the active region 136, thereby forming infused regions 154 below columns 150 and infused regions 155 below columns 152, as shown in FIG. 28. As a result, vertical diodes are formed that have a junction 153 at the interface between silicon substrate 138 and infused regions 155.

Figure 29:
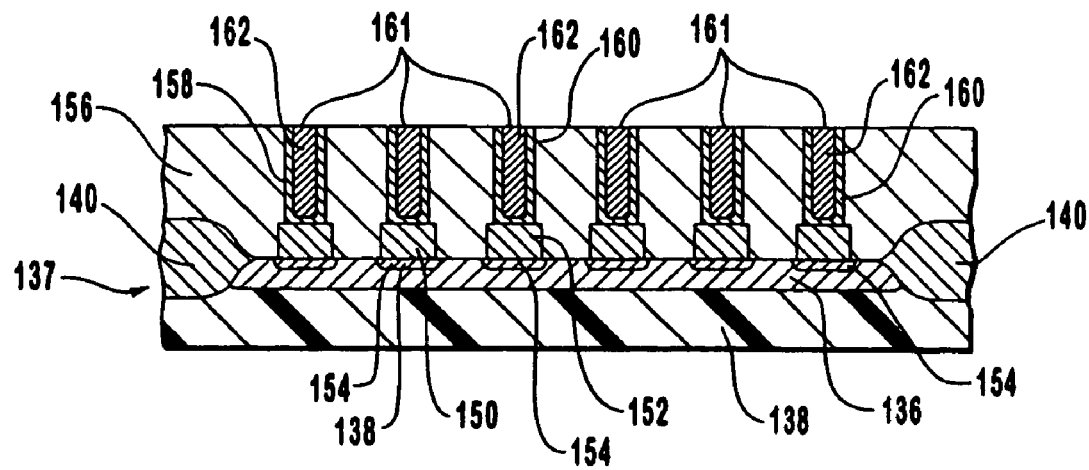
FIG. 29 is a cross-sectional elevation view of the silicon wafer in FIG. 28 having an oxide layer covering the columns with contacts extending through the oxide layer down to the columns.

As shown in FIG. 29, a blanket silicon oxide layer 156, i.e., silicon monoxide or silicon dioxide, is next deposited over the silicon wafer 137 so as to cover columns 150 and 152. A photolithography process is used to etch channels 158 through silicon oxide layer 156 down to each of the columns 150 and 152. A refractory metal silicide layer 160 and a refractory metal nitride layer 161 are next formed on the interior surface of each of the channels 158. Refractory metal silicide layer 160 is formed by initially depositing a refractory metal layer over silicon oxide layer 156 so that the interior surface of channels 158 is lined with the refractory metal layer. Deposition of the refractory metal layer may be accomplished by sputtering, chemical vapor deposition, or most other processes by which metals are deposited. The refractory metal layer is preferably formed of titanium (Ti), however, other refractory metals such as tungsten (W), tantalum (Ta), cobalt (Co), and molybdenum (Mo) can also be used.

Next, an RTP step is used to sinter the refractory metal layer. The sintering step is performed in a nitrogen-($N_2$—) rich environment at a temperature ranging from about 500° C. to about 650° C. The preferred exposure time ranges between about 10 seconds to about 20 seconds.

As a result of the sintering, the top or exposed portion of the refractory metal layer reacts with the surrounding nitrogen to form refractory metal nitride layer 161, for example, TiN. In contrast, the portion of the refractory metal layer adjacent to silicon oxide layer 156 and columns 150 and 152 reacts with the polysilicon to form refractory metal silicide layer 160. The composition of refractory metal silicide layer 160 is dependent on the refractory metal used. Where Ti is used, refractory metal silicide layer 160 is $TiSi_2$. Other silicides that can be formed include, by way of example, $WSi_2$, $TaSi_2$, $CoSi_2$, and $MoSi_2$.

A tungsten layer is next deposited in a blanket over silicon wafer 137 so as to fill the remaining portion of each of channels 158. A CMP process is next used to planarize the surface of the silicon wafer 137 down to the oxide layer 156. As a result, each of channels 158 is filled with a tungsten plug 162 bounded by a refractory metal nitride layer 161 and a refractory metal silicide layer 160.

Figure 30:
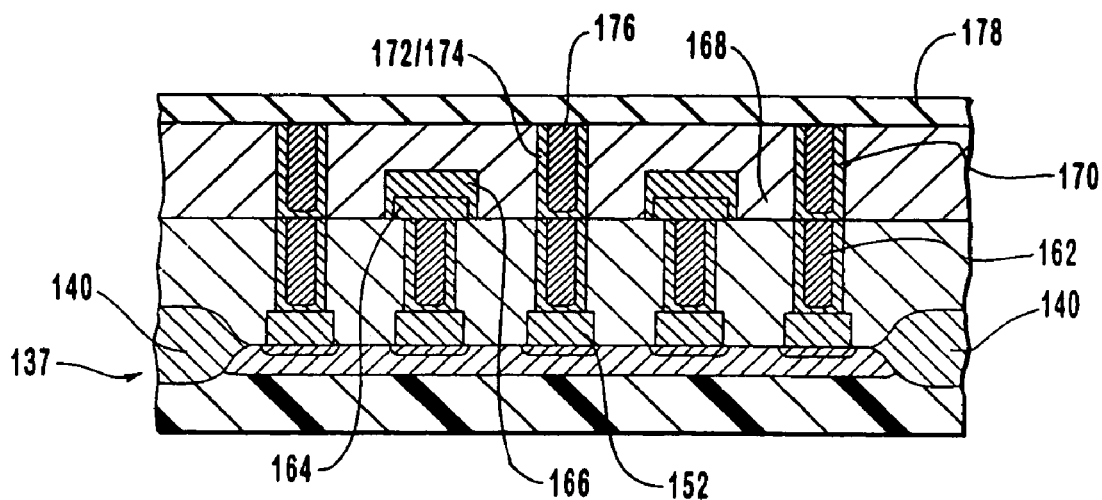
FIG. 30 is a cross-sectional elevation view of the silicon wafer in FIG. 29 showing the inventive diodes having a strapping configuration over the diodes with programmable resistors shown as well.

As shown in FIG. 30, a programmable resistor 164 can be positioned in contact with each of the tungsten plugs 162 over the N-plus columns 150 in the same manner that programmable resistor 46 is formed in contact with polysilicon plug 38 in FIG. 8. A blanket metal layer can next be deposited over silicon wafer 137 and then patterned so as to form metal contact lines 166 contacting and covering programmable resistors 164.

A second blanket oxide layer 168 is next deposited so as to cover metal contact lines 166. The photolithography process is then used to form channels 170 through oxide layer 168 down to tungsten plugs 162 above P-plus columns 152. A refractory metal silicide layer 172, refractory metal nitride layer 174, and tungsten plug 176 are next positioned within each channel 170 in the same way that they are positioned in channel 158. Finally, an aluminum line is deposited in a blanket layer over silicon wafer 137. A patterning step is then used to form contact line 178 that communicates with each of tungsten plugs 176.

Figure 31:
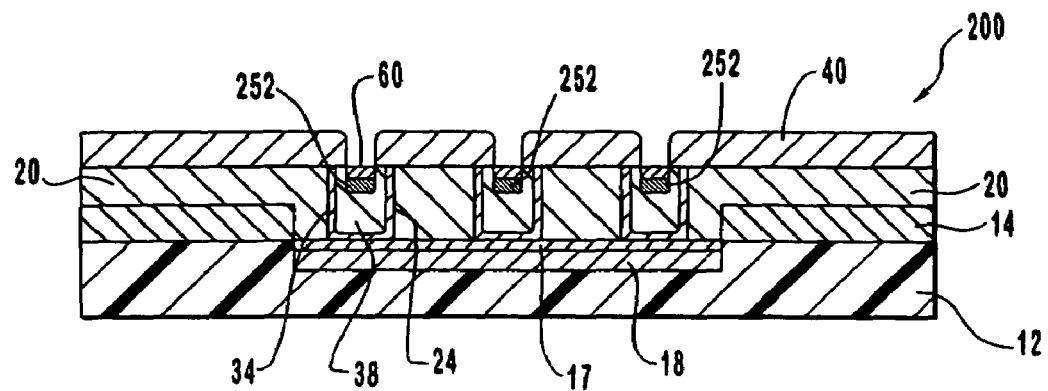
FIG. 31 is a cross-sectional elevation view of a silicon wafer having a metal deposited on doped polysilicon plugs.
Figure 32:
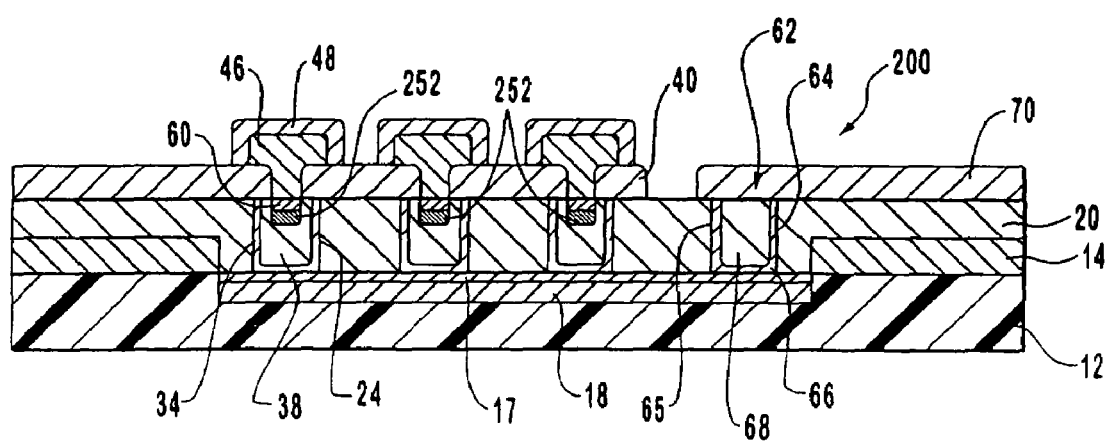
FIG. 32 is a cross-sectional elevation view of the silicon wafer of FIG. 31 having a programmable resistor and metal contact.

In a further alternative embodiment, FIG. 31 depicts a silicon wafer 200 having similar features as the embodiment of FIG. 16, except that a metal layer 60 such as platinum silicide is deposited over a doped portion 252 of a polysilicon plug 38. FIG. 32 shows silicon wafer 200 having a programmable resistor 46 and a metal contact 48 over polysilicon plug 38, similar to the embodiment of FIG. 17.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed is:

1. A diode on a silicon substrate, comprising:
    a silicon substrate lightly doped with a first conductivity type dopant;
    an oxide layer overlaying the silicon substrate, the oxide layer having a top surface and defining a hole which extends through the oxide layer and communicates with a portion of the silicon substrate;
    a polysilicon plug positioned within the hole in the oxide layer, the polysilicon plug being doped with a second conductivity type dopant opposite the first conductivity type dopant;
    an active region formed in the silicon substrate below the polysilicon plug, the active region being doped with the second conductivity type dopant received from the polysilicon plug; and
    a material that is capable of changing states and resistivities vertically over and in communication with the polysilicon plug.

2. The diode as defined in claim 1, wherein the oxide layer defines a channel that extends from the top surface of the oxide layer to the top surface of the polysilicon plug, the polysilicon plug having a top surface that is below the top surface of the oxide layer.

3. The diode as defined in claim 1, wherein the polysilicon plug is at least partially encased by the oxide layer.

4. The diode as defined in claim 1, wherein the material that is capable of changing states and resistivities comprises a programmable resistor, the diode further comprising a metal contact vertically over and in communication with the programmable resistor.

5. The diode as recited in claim 4, wherein the programmable resistor comprises at least one layer comprised of a memory material selected from the group consisting of ovonic and chalcogenide materials.

6. The diode as recited in claim 4, wherein the programmable resistor further comprises at least one barrier layer formed of titanium nitride.

* * * * *